(12) United States Patent
Onozaki et al.

(10) Patent No.: US 8,104,661 B2
(45) Date of Patent: Jan. 31, 2012

(54) HEATING DEVICE, REFLOW DEVICE, HEATING METHOD, AND BUMP FORMING METHOD

(75) Inventors: Junichi Onozaki, Tokyo (JP); Masahiko Furuno, Tokyo (JP); Hiroshi Saito, Tokyo (JP); Isao Sakamoto, Tokyo (JP); Masaru Shirai, Tokyo (JP)

(73) Assignee: Tamura Corporation, Tokyo (JP)

( * ) Notice: Subject to any disclaimer, the term of this patent is extended or adjusted under 35 U.S.C. 154(b) by 114 days.

(21) Appl. No.: 11/909,326

(22) PCT Filed: Mar. 22, 2006

(86) PCT No.: PCT/JP2006/305705
§ 371 (c)(1),
(2), (4) Date: Sep. 21, 2007

(87) PCT Pub. No.: WO2006/101124
PCT Pub. Date: Sep. 28, 2006

(65) Prior Publication Data
US 2009/0008432 A1    Jan. 8, 2009

(30) Foreign Application Priority Data
Mar. 23, 2005  (JP) ................................. 2005-083818

(51) Int. Cl.
*B23K 1/00* (2006.01)
*B23K 1/08* (2006.01)
*B23K 31/02* (2006.01)
(52) U.S. Cl. ................ 228/33; 228/36; 228/57; 228/259
(58) Field of Classification Search ............... 228/124.6, 228/179.1–180.22, 214, 33, 361, 56.1; 438/612–614; 220/573.4, 573.5
See application file for complete search history.

(56) References Cited

U.S. PATENT DOCUMENTS

| 590,212 A | * | 9/1897 | Daesch ........................... 99/416 |
| 4,373,511 A | * | 2/1983 | Miles et al. ................... 126/369 |
| 4,646,628 A | * | 3/1987 | Lederman ....................... 99/413 |

(Continued)

FOREIGN PATENT DOCUMENTS

JP    5-92257    4/1993

(Continued)

OTHER PUBLICATIONS

English Language Abstract of JP 2000-3975.

(Continued)

*Primary Examiner* — Jessica L Ward
*Assistant Examiner* — Carlos Gamino
(74) *Attorney, Agent, or Firm* — Greenblum & Bernstein P.L.C.

(57) ABSTRACT

A solder bump is formed on a substrate by using a heating device where a lid structure blocks hot air from directly blowing against a solder composition. The heating device can reduce high-temperature oxygen molecules that come into contact with the solder composition, oxidation of the solder composition is suppressed. As a result, although the hot air is used for heating, a solder bump can be formed by the liquid-like solder composition. Further, because the lid structure is uniformly heated by the hot air, radiation heat from the lid structure is also uniform, and a container is more uniformly heated. In addition, because the hot air is suppressed from directly blowing against a liquid surface, the liquid-like solder composition is not scattered by the hot air.

12 Claims, 15 Drawing Sheets

U.S. PATENT DOCUMENTS

| | | | | |
|---|---|---|---|---|
| 5,259,546 | A | * | 11/1993 | Volk ............................ 228/102 |
| D409,447 | S | * | 5/1999 | Henry ........................... D7/542 |
| 6,003,757 | A | * | 12/1999 | Beaumont et al. ............ 228/246 |
| 6,252,206 | B1 | * | 6/2001 | Leukhardt et al. ............ 219/486 |
| 6,501,051 | B1 | * | 12/2002 | Richert et al. ................ 219/388 |
| 6,523,419 | B1 | | 2/2003 | Nonaka et al. |
| 2001/0006188 | A1 | * | 7/2001 | DeLaurentis et al. ......... 228/264 |
| 2004/0214420 | A1 | * | 10/2004 | Brouillette et al. ........... 438/616 |

FOREIGN PATENT DOCUMENTS

| | | |
|---|---|---|
| JP | 6-029659 A | 2/1994 |
| JP | 11-068303 A | 3/1999 |
| JP | 2000-3975 | 1/2000 |
| JP | 2000-349118 | 12/2000 |
| JP | 2002-261109 | 9/2002 |
| WO | WO 9314352 A1 * | 7/1993 |

OTHER PUBLICATIONS

English Language Abstract of JP 2000-349118.
English Language Abstract of JP 2002-261109.
English Language Abstract of JP 5-92257.
English language Abstract and translation of JP 6-029659 (Feb. 4, 1994).

* cited by examiner

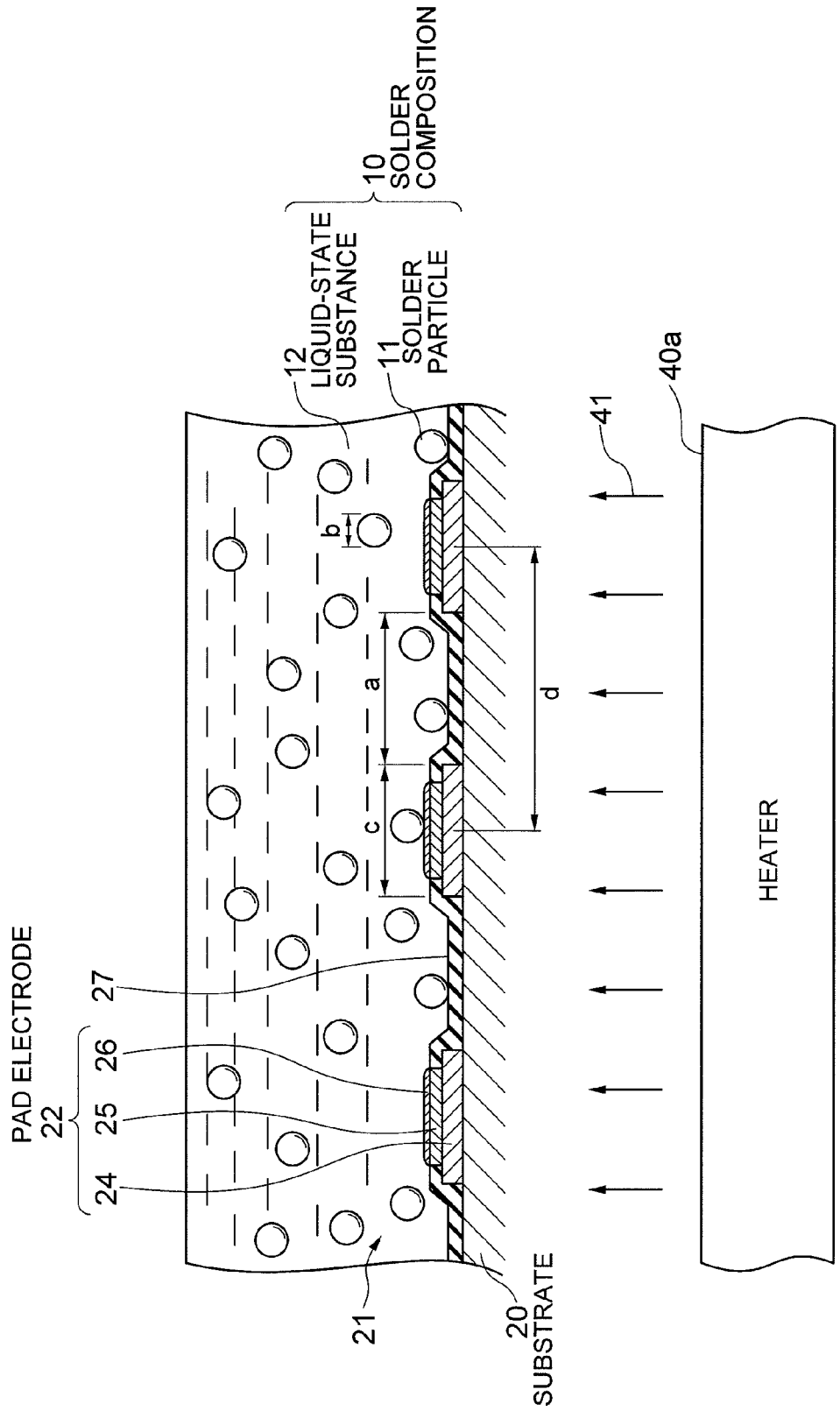

SOLDER BUMP

SOLDER BUMP  SATELLITE BALL

ND BUMP FORMING
HEATING DEVICE, REFLOW DEVICE, HEATING METHOD, AND BUMP FORMING METHOD

TECHNICAL FIELD

The present invention relates to a heating device and a reflow device which are used for forming bumps with liquid solder on a workpiece such as a semiconductor wafer, a substrate board, or an interposer board.

BACKGROUND ART

A typical conventional method for forming solder bumps is to apply a solder paste on pad electrodes of a substrate by using a screen printing method or a dispensing method, and to reflow the solder paste by applying heat. In such case, cream-like solder has been used as the solder paste.

As a reflow device for performing the aforementioned solder bump forming method, there is known a device with a structure that directly places a substrate on a panel heater and heats the substrate by thermal conduction from the panel heater (conventional case 1). However, this reflow device has such a defect that thermal distributions on the substrate become ununiform because of a slight curvature or unevenness of the substrate. There is also known a reflow device which heats a substrate by heat radiation from a panel heater through providing a space between the panel heater and the substrate (conventional case 2). However, this reflow device has such a defect that the heating power for heating the substrate by the panel heater is insufficient. As a reflow device for overcoming the defects of the conventional examples 1 and 2, a reflow device that heats a substrate by applying hot air thereto has been developed (conventional case 3, e.g. Patent Document 1). The reflow device disclosed in Patent Document 1 is constituted to provide a space between hot-air outlets and a substrate, and to heat the substrate by applying hot air from the top and bottom of the substrate so that the substrate can be uniformly heated with a sufficient heating power.

Patent Document 1: Japanese Unexamined Patent Publication H5-92257

DISCLOSURE OF THE INVENTION

However, the reflow device according to the conventional case 3 heats the substrate by applying the hot air from the top and bottom of the substrate, so that the solder paste on the substrate is oxidized due to an influence of the hot air. Therefore, it is difficult to form desired bumps on the substrate.

Further, it has recently been tried out to form the bumps by using a solder composition. As the solder composition, there is such a type where fine solder particles are mixed into a liquid-state substance.

The inventors of the present invention has developed a method for forming solder bumps on a top of a substrate by using the solder composition through heating the substrate by supplying hot air from the bottom-face side of the substrate that is placed in a furnace. In the process of the development, when the hot air on the bottom-face side of the substrate advances into a space area at the upper-face side of the substrate within the furnace, a convection current of the hot air is generated within the space area. Thus, the convention hot air comes in contact with the solder composition, which brings such a problem that proper bumps cannot be formed.

The reason for causing such shortcomings are considered as follows. First, looking into the process for forming the bumps with the solder composition, the solder composition is applied on the top-face side of a substrate, and the solder fine particles are melted and united on the substrate to form the bumps. Alternatively, a substrate is immersed in the solder composition, and the solder fine particles are united on the substrate to form the bumps while heating the solder composition and the substrate.

In the bump forming method, the bumps are formed on the substrate because the solder fine particles are melted and united when the solder fine particles come in contact with the substrate. Thus, when the hot air comes in contact with the solder composition, the liquid-state substance is ruffled, for example, thereby making the solder fine particles within the liquid ununiform. Alternatively, the solder composition may be scattered, thereby generating defects in the bumps. Further, it is considered that the defects of the bumps may be generated because when the hot air on the bottom-face side of the substrate leaks to the upper space area within the furnace, the substrate heating temperature on the top-face side of the substrate increases above a set value, and the solder fine particles are melted and united before coming in contact with the substrate.

An object of the present invention therefore is to provide a heating device and a reflow device with which the issues for forming the bumps by using the solder composition can be overcome.

The inventors of the present invention has come to hold a view that it is necessary to have the solder fine particles contained in the solder composition existed uniformly within the liquid-state substance or it is necessary not to scatter the solder composition when heating a heat-target including the solder composition. Further, the inventors of the present invention come to hold a view that it is necessary to control the heating temperature of the solder composition and the heat-target. Based on the views mentioned above, the inventors of the present invention first have taken a measure for preventing the hot air used for heating the solder composition and the heat-target from being in contact with the solder composition. Then, the inventors of the present invention have taken a measure for controlling the heating temperature for heating the solder composition and the heat-target.

The present invention is constituted based on the aforementioned views. A heating device according to the present invention is a heating device having a heater that heats a heat-target including a solder composition with hot air, which comprises a hot-air suppressing device for suppressing a contact between the hot air and the solder composition.

With the present invention, the solder fine particles do not receive an influence of the hot air when the solder composition is heated, thereby existing uniformly within the liquid of the solder composition. Therefore, regular bumps are to be formed.

Further, the present invention controls a temperature for heating the top-face side of the heat-target by the hot-air suppressing device so as to keep the heating temperature on the top-face side of the heat-target to a temperature that is equal to or lower than the vicinity of a heating temperature on a bottom-face side of the heat-target.

With the present invention, the solder fine particles are united on the heat-target, so that regular bumps are to be formed.

It is desirable for a reflow device using the heating device of the present invention to be constituted as a structure which comprises: a transporting path for transporting the heat-target including the solder composition; a heater for heating the heat-target on the transporting path with hot air; and a hot-air suppressing device for suppressing a contact between the hot air and the solder composition.

In the above, the cases of constituting the present invention as the devices have been described. However, the present invention is not limited to such cases. When the present invention is constituted as a method, a heating method according to the present invention is constituted as a heating method for heating a heat-target including a solder composition with the hot-air, wherein a contact between the hot air and the solder composition is suppressed. In this case, it is desirable to set a heating temperature on a top-face side of the heat-target to be equal to or lower than the vicinity of a heating temperature on a bottom-face side of the heat-target by absorbing the heat of the hot air.

When the heating method according to the present invention is applied to a bump forming method, it is desirable to constitute a bump forming method according to the present invention as a method for forming a bump on a heat-target by heating the heat-target including a solder composition with hot air, wherein a contact between the hot air and the liquid-type solder composition is suppressed. In this case, it is desirable to set a heating temperature on a top-face side of the heat-target to be equal to or lower than the vicinity of a heating temperature on a bottom-face side of the heat-target through controlling the temperature for heating the top-face side of the heat-target by the hot-air suppressing device.

As described above, the present invention is capable of forming regular bumps without having the solder composition affected by the hot air even if the solder composition is used. Further, through controlling the heating temperature on the top-face side of the heat-target to be equal to or lower than the vicinity of the heating temperature on the bottom-face side of the heat-target, the solder fine particles in the solder composition are united on the heat-target such as the substrate. Therefore, regular bumps can be formed.

With the present invention, it is possible to suppress oxidization of the solder composition through blocking the hot air that directly blows against the solder composition with the hot-air suppressing device. Further, due to the presence of the hot-air suppressing device, the heating power to the heat-target from the above can be suppressed. Furthermore, when the heat is applied only from the bottom-face side of the heat-target, the temperature on the top-face side of the heat-target can be stabilized through covering the top face of the heat-target with the hot-air suppressing device. Therefore, it is possible to achieve the reproducible temperature profile. In addition, the hot-air suppressing device can control the temperatures by heating the heat-target with the radiation heat or absorbing the heat of the heat-target depending on the difference between the temperatures on the top face and bottom face of the heat target.

In the case of a lid structure (hot-air suppressing device) that has a mechanism for keeping the heat-target in a low-oxygen atmosphere, high-temperature oxygen molecules that may come in contact with the solder composition can be decreased further. Thus, oxidization of the solder composition can be suppressed further.

In the case of a lid structure (hot-air suppressing device) that has a mechanism for keeping the heat-target in a negative-pressure atmosphere, high-temperature oxygen molecules that may come in contact with the solder composition can be decreased further. Thus, oxidization of the solder composition can be suppressed further. In addition, it is possible to suppress generation of voids when the solder fine particles in the solder composition are united.

In the case where a substrate is used as the heat-target including the solder composition and bumps are formed on the substrate by applying the solder composition, the solder wettability on the substrate can be improved since oxidization of the solder composition can be suppressed. Therefore, solder bumps with a fine pitch can be formed on the substrate.

Further, in the case where a substrate as the heat-target is immersed in a solder composition to form the bumps on the substrate, regular solder bumps can be formed with the solder composition even though heating is performed by using the hot air since oxidization of the solder composition is suppressed. Furthermore, since the hot air directly blown to a liquid surface of the liquid-state substance of the solder composition can be suppressed, not only the solder fine particles contained in the solder composition can be uniformly placed within the liquid-state substance but also scattering and the like of the solder composition can be prevented.

BEST MODES FOR CARRYING OUT THE INVENTION

In the followings, embodiments of the present invention will be described in detail by referring to the accompanying drawings.

First Embodiment

A heating device for heating a heat-target including a solder composition with hot air will be described as a first embodiment of the present invention. In the drawings, the perpendicular direction is enlarged than the actual scales compared to the horizontal direction for convenience' sake.

As a basic structure, a heating device 50 according to the first embodiment of the present invention comprises a heater for heating the heat-target including the solder composition with hot air, which is further provided with a hot-air suppressing device 51. The hot-air suppressing device 51 has a function of suppressing a contact between the hot air and the heat-target, and the hot-air suppressing device 51 according to the first embodiment shown in FIGS. 1A and B is formed as a lid structure that covers the heat-target. Next, the hot-air suppressing device 51 shown in FIGS. 1A and 1B will be described.

The hot-air suppressing device 51 according to the first embodiment shown in FIGS. 1A and B is formed as a lid structure that covers the heat-target. Further, referring to FIG. 1, a case of using a substrate 20 including a solder composition 10 as the heat-target will be described. The substrate 20 has its bottom-face side supported by a container 30. The container 30 has its top-face opened, and has the solder composition 10 filled inside thereof. Further, the first embodiment shown in FIG. 1 uses liquid-type solder as the solder composition 10. The liquid-type solder 10 will be described later.

The lid structure 51 covers the substrate 20 that is supported by the container 30, which is constituted with a peripheral wall 51a that surrounds the container 30, and a top plate 51b for closing the upper opening formed by the peripheral wall 51a. The bottom-face side thereof is formed as an opening for accepting the container 30. The bottom-end edges of the peripheral wall 51a that constitutes the lid structure 51 are supported by a jig 62. Further, the inner space of the lid structure 51 according to the first embodiment shown in FIG. 1 is kept under an atmospheric pressure atmosphere.

Next, a reflow device 70 that uses the above-described heating device 50 according to the above-described first embodiment of the present invention will be described by referring to FIG. 1.

The reflow device 70 according to the first embodiment of the present invention shown in FIG. 1 comprises: a conveyor 60 for transporting the container 30 that supports the substrate 20; heaters for heating the heat-target, i.e. the substrate 20 including the solder composition 10, on the conveyor 60; and a hot-air suppressing device 51. Heaters 40a, 40b shown in FIGS. 1A and B heat the substrate 20 and the solder composition 10 as the heat-target with the hot air 41, 42. The one heater 40a is used as a heater for heating the bottom-face side of the substrate 20, and the other heater 40b is used as a heater for heating the top-face side of the substrate 20.

Further, the conveyor 60 constitutes a transporting path (60) for transporting the heat-target. The conveyor 60 shown in FIG. 1 is in such a structure that gives a feed with an edgeless chain (transporting device 61) which is placed around sprockets 61a. The transporting path (60) is not limited only to the chain-type transporting device 61. A net-type transporting device 61 may be used as well. The point is that any kinds of structure may be used as the transporting path (60) as long as it is possible to give a feed to the substrate 20 as a heat-target. The lid structure 51 as the heat suppressing device individually covers the containers 30 supported by the jig 62 on the conveyor 60. The containers 30 which contains the substrate 20 and the solder composition 10, and the lid structures 51 which covers the containers 30, are formed in one body and fed in the direction of an arrow 63 by the conveyor 60.

Further, even though the lid structure 51 is constituted to respectively cover the individual containers 30 that are transported on the conveyor 60, it is not limited to such case. That is, the lid structure 51 may be placed for every zone on the transporting path (60), and a plurality of containers 30 may be housed in the inner space thereof. Further, under a condition where the hot air 41, 42 is a gas that does not give an adverse influence on the solder composition 10, e.g. inert hot air, and the flow speed is about a rate that does not give an adverse influence on the solder composition 10, etc., the lid structure 51 may be provided with an air-permeability such as a hole structure or a net structure in order to suppress the supply amount of the hot air 41 and 42 to the minimum necessary value.

In the embodiment shown in FIGS. 1A and B, the lid structure 51 is for suppressing the contact between the hot air 41, 42 and the substrate 20. Thus, the lid structure 51 as a hot-air suppressing device is used as a temperature control mechanism for absorbing the heat of the hot air to control the heating temperature on the top-face side of the substrate 20 to a temperature that is equal to or lower than the vicinity of the heating temperature on the bottom-face side of the substrate 20. Even though the heater 40b is arranged on the top-face side of the substrate 20, it is not limited to such case. The transporting path (60) may be housed within a furnace, not shown, and as shown in FIG. 1, the hot air 41 blown from the underneath of the transporting path (60) may be retained in the upper space. Then, the retained heat may be used as a heat source of the heater to be used as the heater for heating the substrate 20 and the like with the heat source. In that case, the hot air 41 supplied from the heater 40a on the bottom side passes through the transporting path (60) and moves up to the upper side, which generates a convection current within the furnace, not shown. Thus, it is possible that the hot air 41 and 42 comes in contact with the solder composition 10. However, the hot air 41 is suppressed from being in contact with the solder composition 10 because of the presence of the lid structure 51, like the case of the hot air 42 from the upper side. As a material for the lid structure 51, aluminum and the like with high heat conductivity are desirable. However, the material is not limited only to those. Other than those materials, a metal such as a stainless steel, or ceramics, etc. may also be used.

In addition to having the function of suppressing the contact between the hot air 42 and the heat-target, the hot-air suppressing device 51 also functions as the temperature control mechanism. Thus, the temperature of the heat-target heated with the hot air 42 becomes lower than the temperature of the heat-target when it comes directly in contact with the hot air 42. Therefore, the top-face side temperature of the substrate 20 heated with the hot air 42 is set to be equal to or lower than the vicinity of the temperature on the bottom-face side of the substrate 20 heated with the hot air 41. The temperature equal to or lower than the vicinity of the bottom-face side temperature of the substrate 20 means the top-face side temperature of the substrate 20 that is almost equal to the bottom-face side temperature of the substrate 20 or lower than the bottom-face side temperature of the substrate 20. In that case, when setting the temperature of the heating, the heat of the hot air may be absorbed by the lid structure 51 to heat the containers 30 and the like with that heat. Alternatively, the lid structure 51 may be formed as a heat insulating structure to control the heating temperature on the top-face side of the substrate 20 for adjusting the heating temperature.

Next, the heat-target (the substrate 20 of the first embodiment) including the solder composition 10 will be described. As the heat-target, a substrate on which a paste-type solder composition (referred to as "solder paste" hereinafter) is mounted may be used. An example thereof may be a case where the solder paste is printed on a printed wiring board, an electronic component is loaded thereon, and the solder is melted with hot air to perform soldering. Oxidization of the solder paste can be suppressed in this case as well.

The heat-target may be the container 30 which encloses the liquid-type solder composition 10 and the substrate 20 immersed in the solder composition 10 as shown in FIG. 1. In that case, oxidation of the solder composition 10 can be suppressed with the lid structure 51 as in the case of the solder paste. Therefore, it becomes possible to form the solder bumps with the liquid-type solder composition 10 even though heating is performed by using the hot air 41 and 42. Moreover, since the hot air directly blown to the liquid surface is suppressed, there is only a little or no scattering of the liquid-type solder composition 10 caused by the hot air.

Further, the container 30 may comprise a flat bottom face 30a for loading the substrate 20, and a peripheral wall 30b for preventing lateral leaks of the solder composition 10. During the heating, the solder composition 10 is also filled into a gap between the substrate 20 and the container 30. Thus, thermal conduction from the container 30 to the substrate 20 becomes uniform in a still better way. Furthermore, with the solder paste in a conventional technique, the size (height) of the solder bumps is changed by adjusting the printing thickness or the content of the solder particles. In the meantime, the embodiment is capable of changing the thickness of the solder composition 10 on the substrate 20 arbitrarily by simply adjusting the loaded amount of the solder composition, since the embodiment uses the liquid-type solder composition 10 and the container 30. Therefore, the size (height) of the solder bumps can be changed easily. The solder composition may not have to be in a liquid-state at a normal temperature if it turns to a liquid-state while being heated.

Next, the solder composition 10 used in the embodiment of the present invention will be described. The liquid-type solder composition 10 is constituted with a mixture of the solder particles and a liquid material (base agent) having a flux effect, and has such a characteristic that it turns to a liquid state at a normal temperature or while being heated. That is, the solder composition 10 is in a liquid state at a normal temperature or it turns to a liquid-state while being heated. For obtaining such characteristic (liquidity), it is required that the viscosity of the liquid material is low, the mixing ratio of the solder particles is small, and the particle diameter of the solder particles is small. During the heating, the solder particles are floated or precipitated in the liquid material. The conventional solder paste is included in such solder composition as long as it turns to a liquid state while being heated.

The liquid material of the solder composition is a liquid-state substance, for example. The liquid-state substance has such a viscosity that it spreads to a uniform thickness because of its own weight when dropped on a plane at a normal temperature, and has a flux effect which causes solder wet on the basic material due to the solder particles when heated up to the melting point of the solder particles or higher. The solder particles have such mixing ratio and particle diameter that they spread and disperse uniformly together with the liquid-state substance when dropped on a plane together with the liquid-state substance.

This solder composition spreads to a uniform thickness by its own weight when dropped on a plane at a normal temperature. In this respect, the solder composition is completely different from the solder paste. For obtaining such characteristic (liquidity), it is required that the viscosity of the liquid-state substance at a normal temperature is low, the mixing ratio of the solder particles is small, and the particle diameter of the solder particles is small. For example, the mixing ratio of the solder particles is preferable to be 30 wt % or less, more preferable to be 20 wt % or less, and most preferable to be 10 wt % or less. The particle diameter of the solder particles is preferable to be 35 μm or less, more preferable to be 20 μm or less, and most preferable to be 10 μm or less.

The solder composition 10 may be constituted in a following structure. The solder particles only have a natural oxidation film on the surface. The flux effect of the liquid-state substance is to promote soldering of the solder particles and the basic material while suppressing unification of the solder particles with each other while being heated to the melting point of the solder particles or higher, and also promotes unifications of the solder particles and a solder coating film formed on the basic material. Such components of the flux effect are specified by the inventors of the present invention through repeatedly carrying out the experiments and investigations.

An example of such components may be an acid. Acids may be broadly classified into inorganic acids (for example, hydrochloric acids) and organic acids (for example, fatty acids). Herein, explanations are provided by referring to the case of an organic acid.

The inventors of the present invention has found that "the organic acid has a small effect of uniting the solder particles with each other but has a large effect of causing solder wet to the pad electrodes". The reasons for generating such effects may be considered as in (1) and (2).

(1) The organic acid has a weak effect of removing the oxidation film of the solder particles. Thus, unification of the solder particles with each other can be suppressed with the natural oxidation film of the solder particles without intentionally forming the oxidation film on the solder particles. Therefore, the embodiment of the present invention does not require a step of forming the oxidation film on the solder particles.

(2) The organic acid for some reasons has an effect of spreading the solder particles on the basic material and alloying the interfaces, and effect of uniting the solder particles with the solder coating film formed on the basic material. The mechanism for causing the solder wet on the basic material even though there is almost no unification of the solder particles with each other is unknown. As an inference, it is considered that there is some kind of reaction generated between the solder particles and the basic material for breaking the slight oxidation film. For example, in the case of a gold-plated basic material, the solder wet is generated even if there is a thin oxidation film on the solder particles, due to the diffusive effect of the gold into the solder. In the case of a copper-made basic material, the copper reacts with the organic acid and turns to organic acid copper salt. When the organic acid copper salt comes in contact with the solder, it is reduced based on a difference in the ionization tendencies. Thus, the metal copper is diffused into the solder, thereby promoting the solder wet. As the reason for the unification of the solder particles with the solder coating film formed on the basic material, the surface tension may be considered, for example.

Further, a liquid-state substance that is mixed with the solder particles may be a fat and oil, and the component contained in the liquid-state substance may be a free fatty acid that is contained in the fat and oil. The fats and oils are widely distributed for various purposes, so that those are easily obtained, low cost, and nontoxic. Moreover, the fats and oils originally contain the organic acid, namely the free fatty acid. Particularly, fatty ester (for example, neopentyl polyol ester) is excellent in heat/oxidation stability in general, so that it is optimum for soldering. Further, it is preferable for the acid value of the fat and oil to be 1 or more for having a sufficient content of the free fatty acid. The acid value means the value of potassium hydroxide in milligrams required for neutralizing the free fatty acid that is contained in the fat and oil. That is, the larger the acid value, the more the free fatty acid is contained. The main characteristic of trimethyl propane trioleate is that the kinematic viscosity thereof at 40° C. is 48.3 $mm^2/s$, kinematic viscosity at 100° C. is 9.2 $mm^2/s$, and the acid value is 2.4.

It is noted that the "solder" herein does not only mean the solder used for forming solder bumps but also include the solder used for die-bonding semiconductor chips, and the solder that is called "soft solder" used for bonding copper pipes, for example. Naturally, it also includes the lead-free solder. The "solder bump" is not limited only to a hemispherical type or protruded type. It also includes a film type. The "solder coating film" is not limited only to a film type. It also includes a hemispherical type and a protruded type. The "substrate" includes a semiconductor wafer, a wiring board, and the like. The "liquid-state substance" may be a fluid substance other than the liquid, and may be a fluorine-based high-boiling point solvent or a fluorine-based oil other than the oils and fats.

Because the hot-air suppressing device 51 blocks the hot air 41 and 42 which is directly blown to the solder composition 10, the high-temperature oxygen molecules coming in contact with the solder composition 10 can be decreased. Thus, oxidation of the solder composition can be suppressed. It is not essential for the hot-air suppressing device 51 to block all the hot air 41 and 42 but may block only a part of the hot air.

As described above, the hot-air suppressing device 51 itself may be heated with the hot air, and may heat the heat-target with the radiation heat generated thereby. In that case, the hot-air suppressing device 51 is heated uniformly with the hot air, so that the radiation heat from the hot-air suppressing device 51 becomes uniform as well. As a result, the heat-target can be heated uniformly in a still better way.

Next, described is a case of heating a heat-target by using the heating device shown in FIG. 1.

First, as shown in FIG. 2A, the substrate 20 is loaded in the container 30, the solder composition 10 is filled within the container 30, and the solder composition 10 is brought into a contact with the top face of the substrate 20 where the bumps and the like are to be formed. Then, as shown in FIG. 2B, the container 30 is loaded on the jig 62, and the container 30 is covered by the lid structure 51. In that case, it is desirable to seal between the bottom end parts of the lid structure 51 and the jig 62 air-tightly with a sealing material. Subsequently, as shown in FIG. 2C, the hot air 41 is blown from the lower side of the jig 62 towards the upper side, and the hot air 42 is blown from the upper side of the jig 62 towards the lower side. The hot air 41 from the lower side of the jig 62 heats the bottom-face side of the substrate 20, and the hot air 42 from the top-face side of the jig 62 heats the top-face side of the substrate 20. The lid structure 51 covering the container 30 deprives the heat from the hot air 42 to set the temperature on the top-face side of the substrate 20 heated with the hot air 42 to be equal to or lower than the vicinity of the temperature on the bottom-face side of the substrate 20 heated with the hot air 41.

The lid structure 51 suppresses the hot air 42 from the upper side from being in contact with the solder composition 10, and suppresses the hot air 41 from the lower side from going around to be in contact with the solder composition 10.

Next, as shown in FIG. 1, described is the case where the bottom-face side and the top-face side of the substrate 20 are heated by the heaters 40a and 40b. When the substrate 20 is heated by the heaters 40a and 40b from the bottom-face side and the top-face side, the lid structure 51 absorbs the heat from the heater 40b on the top-face side and heats the substrate 20 with the radiation heat. Inversely, when the temperature of the substrate 20 side is higher than the temperature of the lid structure 51, the lid structure 51 absorbs the heat from the substrate 20.

Further, when the substrate 20 is heated only from the bottom-face side by the heater 40a, the temperature on the top-face side of the substrate 20 can be stabilized because the substrate 20 is covered by the lid structure 51. Thus, when the temperature of the substrate 20 is higher than the temperature of the lid structure 51, the lid structure 51 can absorb the heat of the substrate 20, thereby achieving a reproducible temperature profile.

Further, in the case where the lid structure 51 is formed as a heat insulating structure, the temperature on the top-face side of the substrate 20 when heated by the heater 40b is controlled by the lid structure 51 which is formed as a heat insulating structure in the case where the bottom-face side and the top-face side of the substrate 20 are heated by the heaters 40a and 40b, respectively. Further, in the case where only the heater 40a is provided on the bottom-face side of the substrate 20 and the lid structure 51 is formed as a heat insulating structure, the hot air from the heater 40a goes around towards the top-face side of the substrate 20, and the temperature of the hot air that heats the top-face side of the substrate 20 is controlled by the lid structure 51.

It is needless to say that the heating temperature on the top-face side of the substrate 20 is set to be equal to or lower than a rage of the heating temperature on the bottom-face side of the substrate 20, when heating the top-face and bottom-face sides of the substrate 20 as described above.

Next, operations and effects of the heating device and the heating method of the embodiment will be described. The lid structure 51 is capable of decreasing the high-temperature oxygen molecules that come in contact with the solder composition 10 through blocking the hot air 41 and 42 which directly blow against the solder composition 10. Thus, oxidation of the solder composition 10 can be suppressed. Therefore, it becomes possible to form the solder bumps with the liquid-type solder composition 10 even though it is heated by using the hot air 41 and 42. Further, since the lid structure 51 is heated uniformly with the hot air 41 and 42, the radiation heat from the lid structure 51 becomes uniform as well. As a result, the container 30 can be heated uniformly in a still better way. Moreover, because the hot air 41 and 42 blowing directly against a liquid surface 13 of the solder composition 10 can be suppressed, the liquid-type solder composition 10 is not scattered by the hot air 41 and 42.

Next, described is a method for forming the solder bumps with the liquid-type solder composition by using the reflow device according to the first embodiment of the present invention shown in FIG. 1. FIG. 1 shows a state where the solder composition is applied on the substrate, in which the vertical direction is illustrated in an expanded scale than the horizontal direction.

The solder composition used in the embodiment is constituted with a mixture of a great number of solder particles 11 and a liquid-state substance 12 made of fatty acid ester, and it is used for forming the solder bumps on pad electrodes 22. The liquid-state substance 12 has such a viscosity that it spreads to a uniform thickness with its own weight when dropped on the substrate 20 at a normal temperature, and has a flux effect which causes solder wet to the pad electrodes 22 due to the solder particles 11 when heated to the melting point of the solder particles 11 or higher. The solder particles 11 have such mixing ratio and particle diameter that the solder particles 11 are spread and dispersed uniformly together with the liquid-state substance 12 when dropped on the substrate 20 together with the liquid-state substance 12.

The solder particles 11 only have a natural oxidation film (not shown) on the surface. The liquid-state substance 12 is fatty acid ester, so that it originally contains free fatty acid that is a kind of organic acids. While being heated to the melting point of the solder particles 11 or higher, the free fatty acid works to promote soldering of the solder particles 11 and the pad electrodes 22 while suppressing unification of the solder particles 11 with each other, and also to promote unifications of solder coating film formed on the pad electrodes 22 and the solder particles 11.

An organic acid contained in the liquid-state substance 12 may be added as necessary. That is, the content of the organic acid in the liquid-state substance 12 is adjusted in accordance with the degree of oxidation and the amount of the solder particles 11. For example, when forming a large number of solder bumps, the amount of the solder particles 11 becomes extensive as well. Therefore, it is necessary to contain a sufficient amount of organic acid for reducing the oxidation film for all the solder particles 11. Meanwhile, in the case where the excessive solder particles 11 than the amount to be used for forming the bumps are added, it is possible to perform optimum bump formation only with the relatively large solder particles 11 by not melting the solder particles 11 on the fine sides in so-called the solder powder grain size distribution through deteriorating the active power of the liquid-state substance 12 by decreasing the content of the organic acid. In such case, the fine particles 11 that are remained without being melted also have the effect of decreasing the short-circuit on the pad electrodes 22 through preventing the unification of the solder particles 11 with each other.

The solder particles 11 need to be dispersed uniformly in the liquid-state substance 12, so that it is desirable to stir the solder composition 10 right before the use. As the material for the solder particles 11, tin-lead based solder, lead-free solder, or the like is used. It is preferable to set a diameter b of the solder particle 11 to be shorter than a shortest distance a between the peripheral ends of the neighboring pad electrodes 22. In that case, the solder particles 11 which have respectively reached the solder coating film on the two neighboring pad electrodes 22 do not contact with each other, so that the solder particles 11 do not unite with each other. Thus, no bridge is formed therebetween.

The solder composition 10 is dropped by a natural fall at a normal temperature on the substrate 20 that has the pad electrodes 22. Simply with this, the solder composition 10 in a uniform thickness can be applied on the substrate 20. That is, it is possible to form a coating film of the solder composition 10 in a uniform thickness on the substrate 20 without using screen printing or a dispenser. The uniformity of coating affects the variations in the solder bumps, so that coating is applied uniformly as much as possible. Thereafter, the entire substrate 20 is heated uniformly to achieve formation of the solder bumps. It requires only a short time of heating to increase the temperature to the solder melting point or higher. By increasing the temperature in a short time, deterioration in the active power of the organic acid in the process can be suppressed.

Next, the substrate 20 used in the embodiment will be described. The substrate 20 is a silicon wafer. The pad electrodes 22 are formed on a surface 21 of the substrate 20. The solder bumps are formed on the pad electrodes 22 by the forming method of the embodiment. The substrate 20 is electrically and mechanically connected to other semiconductor chip or wiring board via the solder bumps. The shape of the pad electrode 22 is a circle, for example, and a diameter c is 40 μm, for example. A distance d between the centers of the neighboring pad electrodes 22 is 80 μm, for example. A diameter b of a solder particle 11 is 3-15 μm, for example.

The pad electrode 22 is constituted with an aluminum electrode 24 formed on the substrate 20, a nickel layer 25 formed on the aluminum electrode 24, and a metal layer 26 formed on the nickel layer 25. The nickel layer 25 and the metal layer 26 are UBM (under barrier metal or under bump metallurgy) layers. The substrate 20 other than the pad electrodes 22 part is covered by a protection film 27.

Next, a method for forming the pad electrodes 22 will be described. First, the aluminum electrodes 24 are formed on the substrate 20, and the protection film 27 is formed on the part other than the aluminum electrodes 24 by a polyimide resin or a silicon nitride film. These are formed by using a photolithography technique or an etching technique, for example. Subsequently, after applying a zincate treatment on the surface of the aluminum electrodes 24, the nickel layer 25 and the metal layer 26 are formed on the aluminum electrodes 24 by using an electroless plating method. The UBM layers are provided to give the solder wettability to the aluminum electrodes 24.

As the materials for the solder particles 11, used is Sn—Pb (melting point at 183° C.), Sn—Ag—Cu (melting point at 218° C.), Sn—Ag (melting point at 221° C.), Sn—Cu (melting point at 227° C.), lead-free solder, or the like.

The heater 40a is constituted with a blower, an electric heater, or the like, for example, which heats the bottom-face side of the substrate 20 by blowing the hot air against the bottom-face side. Although not shown in FIG. 3, the heater 40b for heating the top-face side of the substrate 20 with the hot air 42 is provided as in FIG. 1, and the container 30 to which the solder composition 10 and the substrate 20 are enclosed is covered by the lid structure 51. The lid structure 51 functions as a heater for heating the top-face side of the substrate 20 with the radiation heat by being heated with the hot air 42. At the same time, the lid structure 51 has a function of avoiding the contact between the hot air 41, 42 and the solder composition 10. Further, since the lid structure 51 suppresses the contact between the hot air 42 and the heat-target, the temperature of the heat-target when heated with the hot air 42 becomes lower than the temperature thereof when the hot air 42 directly comes in contact with the heat-target. Thus, the temperature on the top-face side of the substrate 20 heated with the hot air 42 (including the radiation heat of the lid structure 51) is set to be equal to or lower than the vicinity of the temperature on the bottom-face side of the substrate 20 that is heated with the hot air 42.

When forming a bump on the electrode 22 of the substrate 20, first, as shown in FIG. 4A, the substrate 20 is placed in the container 30. Then, after stirring the solder composition 10 within a pouring vessel 31 as necessary, the solder composition 10 is dropped on the substrate 20 from a spout 32. Upon this, the solder composition 10 spreads to a uniform thickness by its own weight. At this stage, the temperature may be a normal temperature. Moreover, natural fall of the solder composition 10 can be utilized. It is noted that the solder composition 10 may also be applied on the substrate 20 by using a printing device or a dispenser.

The container 30 is heated in a reflow step along with the substrate 20, so that it is made of metal such as aluminum, which has heat-resistive property, a good heat conductivity, and generates no solder wet by the solder particles 11. Further, the container 30 comprises a flat bottom face 33 for loading the flat-plate type substrate 20, and a peripheral wall 34 for preventing the lateral leak of the solder composition 10. In this case, the substrate 20 is closely fitted on the bottom face 33 of the container 30, thereby improving the heat conductivity. The container 30 is omitted in FIG. 3 and FIG. 5.

Further, the solder composition 10 on the substrate 20 may be set to a uniform thickness by rotating the substrate 20 horizontally in the middle of or after the dropping step. For rotating the substrate 20 horizontally, a spin-coating device that is available on the market may be used.

There are two ways of ending the dropping step depending on whether or not to drop the solder composition 10 until the substrate 20 is immersed in the solder composition 10. FIG. 4B shows the case where the substrate 20 is not immersed in the solder composition 10. In this case, a thickness t1 of the solder composition 10 on the substrate 20 is a value determined based mainly on the surface tension and the viscosity of the solder composition 10. Meanwhile, FIG. 4C shows the case where the substrate 20 is immersed in the solder composition 10. In this case, a thickness t2 of the solder composition 10 on the substrate 20 can be set to a desired value in accordance with the dropping amount of the solder composition 10.

Through the dropping step described above, the solder composition 10 is applied all over the substrate 20 where a plurality of pad electrodes 22 are provided with a space therebetween as shown in FIG. 3. At this stage, the solder composition 10 is loaded entirely over the surface including the plurality of pad electrodes 22 and the protection film 27 provided therebetween. The solder composition 10 is in a state just like ink.

Subsequently, when heating of the substrate 20 and the solder composition 10 is started in a reflow step, the viscosity of the liquid-state substance 12 is further deteriorated. Upon this, as shown in FIG. 5A, the solder particles 11 precipitate and build up on the pad electrodes 22 and the protection film 27, since the specific gravity of the solder particles 11 is heavier than that of the liquid-state substance 12.

Then, as shown in FIG. 5B, the solder composition 10 is heated by receiving the radiation heat of the lid structure 51, and the bottom-face side of the substrate 20 is heated with the hot air 41. In the embodiment, the heating temperature on the top-face side of the substrate 20 is set to be equal to or lower than the vicinity of the heating temperature on a bottom-face side of the substrate 20. Thus, the temperature becomes lower as going closer to the surface of the solder composition located on the top-face side of the substrate 20, and the temperature becomes higher as going closer to the substrate 20 side. With this, the lower-side solder particles 11 closer to the pad electrodes 22 start to melt first, which get wet and spread on the pad electrodes 22 when melted. At this stage, the upper-side solder particles 11 away from the pad electrode 22 are not sufficiently melted yet. Therefore, chances for the solder particles 11 to be united with each other can be decreased, so that generation of solder bridges can be suppressed as well. In other words, in the reflow step, the pad electrodes 22 are heated first up to the melting point of the solder particles 11 or higher, thereby melting the solder particles 11 that are in contact with the pad electrodes 22 for forming a solder coating film 23' that is wet and spread over the pad electrodes 22, and the solder particles 11 are united further with the solder coating film 23'.

Further, at this stage, a following state is generated due to an effect of the organic acid contained in the liquid-state substance 12. First, the solder particles 11 are suppressed from being united with each other. However, although not shown in FIG. 5B, a part of the solder particles 11 are united with each other and become larger. That is, it is no problem even if the solder particles 11 are united with each other as long as the size thereof is smaller than a certain size. In the meantime, the solder particles 11 spread over the pad electrodes 22 to form an alloy layer on the interface. As a result, the solder coating film 23' is formed on the pad electrodes 22, and the solder particles 11 are united further with the solder coating film 23'. That is, the solder coating film 23' grows to form solder bumps 23 as shown in FIG. 5C.

Referring to FIG. 5C, the solder particles 11 that are not used for forming the solder bumps 23 are washed off at a latter step along with the remained liquid-state substance 12.

Further, in the reflow step, the solder particles 11 closer to the substrate 20 side may be precipitated first by providing a difference in the temperatures of the solder composition 10 such that the surface side thereof is lower and the substrate 20 side is higher. By providing such difference in the temperatures that the surface side of the solder composition 10 is lower and the substrate 20 side thereof is higher, the lower-side solder particles 11 closer to the pad electrodes 22 start to precipitate and melt first, and get wet and spread when coming in contact with the pad electrodes 22, since the viscosity of the liquid-state substance 12 is deteriorated as the temperature gets higher. At that stage, the upper-side solder particles 11 away from the pad electrodes 22 are not sufficiently precipitated and melted yet. Therefore, chances for the solder particles 11 to be united with each other can be decreased, so that generation of solder bridges can also be suppressed further. Such heating condition can be achieved by heating the solder composition 10 on the substrate 20 from the substrate 20 side while cooling the surface side of the solder composition 10, or by controlling the relation between the temperature dependency of the viscosity of the liquid-state substance 12 and the melting point of the solder particles 11, for example.

Further, in the reflow step, the solder particles 11 may be supplied to the pad electrodes 22 by utilizing a convection current of the liquid-state substance 12. When the solder composition 10 is heated from the substrate 20 side, a convection current is generated in the liquid-state substance 12. Thereby, the solder particles 11 move within the liquid-state substance 12. Thus, the solder particles 11 that are not loaded on the pad electrodes 22 are also moved onto the pad electrodes 22 to be a part of the solder bumps 23. As a result, the solder particles 11 can be utilized effectively.

Second Embodiment

A modification example of the heating device according to the first embodiment of the present invention will be described as a second embodiment.

A heating device 50a according to the second embodiment of the present invention shown in FIG. 6 is characterized to provide a mechanism to a lid structure 51 for keeping the space where a heat-target is covered by the lid structure 51 to a low-oxygen atmosphere. That is, the lid structure 51 is provided with valves 52 and 53 which seal and keep a nitrogen gas $N_2$ within the space inside the lid structure 51. Further, sealing members 71 such as rubbers for increasing the sealing property are attached to an end face 54 of the lid structure 51 that comes in contact with a jig 62.

Next, a heating method using the heating device 50a shown in FIG. 6A will be described. First, as shown in FIG. 6B, a solder composition 10 and a substrate 20 are placed in a container 30, the container 30 is loaded on the jig 62, and the container 30 is covered by the lid structure 51. At this stage, an inert gas such as a nitrogen gas $N_2$ is filled inside the lid 51 by connecting a valve 56 of a nitrogen tank 55 and the valve 52 of the lid 51, and setting the valves 56, 52, and 53 to "open", for example. Subsequently, as shown in FIG. 6C, the valves 52, 53 are set to "closed", and the container 30 is heated with the hot air 41, 42.

With the heating device and the heating method of this embodiment, not only the same effect as that of the first embodiment can be achieved but also oxidation of the solder composition 10 can be suppressed further, since the high-temperature oxygen molecules that come in contact with the solder composition 10 can be decreased further.

Third Embodiment

FIG. 7 shows sectional views showing a heating device according to a third embodiment of the present invention, and heating step is executed in order of FIGS. 7A, 7B, and 7C. Explanations will be provided hereinafter by referring to the drawings. However, same reference numerals are applied to the same components as those of FIG. 2, and explanations thereof will be omitted.

In a heating device 50b according to the third embodiment of the present invention shown in FIG. 7, a lid structure 51 is provided with a mechanism for keeping the space covered by the lid structure 51 to a negative-pressure atmosphere. That is, the lid structure 51 is provided with a valve 52 which keeps the space inside the lid structure 51 to be under a negative pressure. Further, sealing members 71 such as rubbers for increasing the sealing property are attached to an end face 54 of the lid structure 51 that comes in contact with a jig 62.

Next, a heating method using the heating device 50b will be described. First, as shown in FIG. 7A, a solder composition 10 and a substrate 20 are placed in a container 30. Then, as shown in FIG. 7B, the container 30 is loaded on the jig 62, and it is covered by the lid structure 51. At this stage, by connecting a vacuum pump 57 and a valve 52 of the lid 51 through a pipe, for example, and the vacuum pump 57 is driven to set the valve 52 to "open" for turning the inside the lid structure 51 to a negative pressure. Subsequently, the valve 52 is set to "closed", and the container 30 is heated with the hot air 41, 42 as shown in FIG. 7C.

With the heating device and the heating method of this embodiment, not only the same effect as that of the first embodiment can be achieved but also oxidation of the solder composition 10 can be suppressed further, since the high-temperature oxygen molecules that come in contact with the solder composition 10 can be decreased further. Moreover, the lid structure 51 is pressed against the jig 62 by the atmospheric pressure, so that the lid structure 51 is tightly fixed thereto. Particularly, it is effective for the case where there is a risk that the lid 51 may be blown off or shifted by the pressure of the hot air 41, 42. Further, the embodiment has an advantage of decreasing the generation of voids in the soldered junctions, since the inside space of the lid structure 51b is kept to the negative-pressure atmosphere.

Next, FIG. 8 shows the result of the case where the solder bumps are formed by a reflow device that utilizes the heating device according to the embodiment of the present invention, and the result of the case where the solder bumps are formed by a reflow device according to a conventional example.

With a reflow device 70 according to the embodiment of the present invention, the substrate 20 including the solder composition 10 is covered by the lid structure 51 (51a, 51b) to avoid the contact between the hot air 41 and the solder composition 10. Thus, the hot air 41 does not give an influence on the solder composition 10. Therefore, as shown in FIG. 8A, there is no solder bridge formed, and high-quality and uniform-sized solder bumps are formed when the lid structure 51 is provided.

In the meantime, when the solder bumps are formed by using the reflow device according to the conventional example, solder bumps are formed as shown in FIG. 8B. However, since there is no such component that corresponds to the lid structure, so that the hot air directly affects the solder composition. Therefore, it can be found by carefully observing FIG. 8B that satellite balls protruding towards the outer side are formed on the periphery of the solder bumps. It can be seen that the satellite balls are formed to a large number of solder bumps. The satellite balls are the solder attached to the periphery of the solder bumps without being formed into the solder bumps, and these are the reason for generating the solder bridges.

In FIGS. 8A and B, white dots can be observed in the vicinity of the centers of the solder bumps that are shown with black circles. The white dots are the lighting used when photographing the solder bumps, which are pictured into a part of the video. Although it is hard to recognize with the photographs shown in FIG. 8, since the solder composition 10 does not receive an influence of the hot air with the embodiment of the present invention, the sizes and the shapes of the solder bumps are consistent, and it can be found that the white dotes in many of the solder bumps are located at the common positions as shown in FIG. 8A.

In the meantime, as shown in FIG. 8B, the positions and the sizes of the white dotes are inconsistent in the case of the conventional example. As a result, it can be seen that the formation and the sizes of the solder bumps are inconsistent.

Needless to say, the present invention is not limited to the above-described embodiments. For example, the following structures may be employed. (1) Instead of the silicon wafer (FC), a fine-pitched substrate or interposer, or a wiring board (BGA) may be used. (2) The electrode material for the substrate is not limited to aluminum but Al—Si, Al—Si—Cu, Al—Cu, Cu, or the like may be used. (3) The heat-target is not limited to the container to which the liquid-type solder composition and the substrate are placed. A substrate on which solder paste and electronic parts are loaded, a substrate on which a flux is applied on solidified solder and electronic parts are loaded, or the like may be used. (4) The hot-air suppressing device is not limited to the lid structure. For example, a well-closed container or the like may be used.

Fourth Embodiment

FIG. 9 shows an embodiment regarding the structure for supporting the container 30 to a transporting device 61. As shown in FIG. 9, the right and left ends of a jig 62 are supported between two transporting devices 61, 61 arranged on the right and left, such as a chain loaded around the sprockets 61a of FIG. 1, and a peripheral wall 30b of the container 30 is accepted into a supporting hole 62a of the jig 62 thereby to support the container 30 to the transporting device 61 via the jig 62.

The jigs 62 are arranged at a constant interval in the length direction of the transporting device 61, and each of the jigs 62 accepts the container 30 in the supporting hole 62a to support it. Further, the lid structure 51 individually covers the containers 30 that is supported to the jig 62 so as to avoid the contact between the hot air 42 and the solder composition 10 within the container 30

Fifth Embodiment

The lid structure 51 in the heating device shown in FIG. 10 is formed into a double structure with inner side and outer side, which is provided with a heat insulating layer 51c.

The lid structure 51 according to the fourth embodiment shown in FIG. 10 will be described in detail. The lid structure 51 according to the fourth embodiment comprises: an inner lid 51d and an outer lid 51e in different sizes, which are arranged doubly on the inner side and the outer side; and the heat insulating layer 51c interposed between the inner lid 51d and the outer lid 51e. The bottom edges of the inner lid 51d and the outer lid 51e are supported to the jig 62 to which a feed is given by a conveyor 60. The contact face between the jig 62 and the bottom edges of the inner lid 51d as well as the outer lid 51e may be sealed air-tightly by a sealing material. Further, even though the heat insulating layer 51c is formed by an air layer in this embodiment, the heat insulating layer 51c may be formed by a heat insulating material.

The lid structure 51 according to the embodiment is constituted with the lids 51d and 51e doubly on the inner side and the outer side, and the heat insulating layer 51c is interposed between the both. Thus, it is not only possible to interrupt the contact between the hot air 41 and the solder composition 10 but also possible to decrease the degree of heat applied by the hot air 42 to the inner lid 51d that faces towards the solder composition 10 to be extremely small. This means that the heat insulating layer 51d works as a mechanism for controlling the radiation heat of the lid structure 51. Therefore, the lid structure 51 according to the embodiment has an advantage that it is capable of more accurately setting the temperature on the top-face side of the substrate 20 that is heated with the hot air 42 (including the radiation heat of the lid structure 51) to be equal to or lower than the vicinity of the temperature on the bottom-face side of the substrate 20 heated with the hot air 42.

Furthermore, it is possible to decrease the heating power for the top-face side of the substrate 20 by making the thermal capacity of the heat-target such as the substrate 20, the lid structure 51, the jig 62, and the liquid-state substance of the solder composition 10 relatively small. This means that it is possible to more accurately set the temperature on the top-face side of the substrate 20 that is heated with the hot air 42 (including the radiation heat of the lid structure 51) to be equal to or lower than the vicinity of the temperature on the bottom-face side of the substrate 20 heated with the hot air 42.

Sixth Embodiment

A lid structure 51 shown in FIG. 11 is a modification of the lid structure shown in FIG. 10. That is, the lid structure 51 of the embodiment shown in FIG. 11 is obtained by uniting the bottom edges of an inner lid 51$d$ and an outer lid 51$e$ into one body, and a heat insulating layer 51$c$ is sealed inside thereof.

With this embodiment, the heat insulating layer 51$c$ is shuttered from the outside. Thus, the heat of the hot air 41 can be blocked effectively. Therefore, compared to the fifth embodiment, there is an advantage that it is capable of more accurately setting the temperature on the top-face side of the substrate 20 that is heated with the hot air 42 (including the radiation heat of the lid structure 51) to be equal to or lower than the vicinity of the temperature on the bottom-face side of the substrate 20 heated with the hot air 42.

Seventh Embodiment

In a heating device 50 according to a seventh embodiment of the present invention shown in FIG. 12, a plate 52 is provided on the top face of the lid structure 51 that is to be in contact with the hot air 41, so that the temperature of the radiation heat by the lid structure 51 can be controlled by diffusing the heat with the plate 52.

The lid structure 51 of the embodiment shown in FIG. 12 is capable of controlling the radiation heat of the lid structure 51 by diffusing the heat with the plate 52. Therefore, compared to the case of the first embodiment, there is an advantage that it is capable of more accurately setting the temperature on the top-face side of the substrate 20 that is heated with the hot air 42 (including the radiation heat of the lid structure 51) to be equal to or lower than the vicinity of the temperature on the bottom-face side of the substrate 20 heated with the hot air 42.

Eighth Embodiment

An eighth embodiment shown in FIG. 13 shows an example of a structure that is a modification of the lid structure shown in FIG. 11. A lid structure 51 of the eighth embodiment shown in FIG. 13 comprises a check valve 53 as a mechanism for keeping an inner space 51$g$ of an inner lid 51$d$ to a negative-pressure atmosphere, and the lid structure 51 is provided to every zone of a transporting path (60). That is, this embodiment provides a structure where a plurality of containers 30 are accepted inside the inner lid 51$d$ of the lid structure 51, and the containers 30 in the lid structure 51 are transported by the conveyor 60. A substrate 20 including a solder composition 10 is placed inside the container 30.

A conventional device with a decompression atmosphere employs a system where gate valves are provided at the exit and entrance of a furnace, and the gate valves are opened and closed. This system requires a zone for evacuation and a zone for returning to the normal pressure from the vacuum for each workpiece, so that there is a limit in the processing capacity. In addition, the cost for the device becomes extremely high.

In the meantime, it is possible with the embodiment to perform a series of processing continuously through providing the lid structure 51 to every zones of the chain transporting path as the conveyor 60 that is used in a typical reflow device. Further, the temperatures of the jig 62 and the substrate 20 are increased by the heat of the convection current from the lower side, so that the temperature distributions of the jig 62 and the substrate 20 can be made uniform. Furthermore, since the substrate 20 and the solder composition 10 can be heated under the decompression atmosphere in the lid structure 51, so that there is an advantage that generation of voids can be prevented.

Ninth Embodiment

A lid structure 51 according to an embodiment shown in FIG. 14 and FIG. 15 comprises a check valve 54 provided as a mechanism for keeping an inside space 51$g$ covering the heat target to a pressurized atmosphere. As shown in FIG. 15, a sealing material 55 is provided to tightly seal between the junction part (between an inner lid 51$d$ and an outer lid 51$e$ of the lid structure 51) and a jig 62.

Regarding the lid structure 51 according the a ninth embodiment, the inside space 51$g$ formed inside the inner lid 51$d$ is kept to a pressured state. Thus, the boiling point of an organic acid (breakdown product) contained in the liquid-state substance of a solder composition 10 within a container 30 becomes high, which has an effect of decreasing evaporation of the organic acid within the solder composition 10. Through this, generation of bubbles within the liquid-state substance in the heated solder composition 10 can be suppressed. Therefore, when the solder fine particles precipitate in the liquid-state substance, the influence of the bubbles can be suppressed as much as possible so as to form stable bumps. Further, through pressurization, it becomes possible to have the organic acid that is the breakdown product remained within the liquid-state substance, i.e. it is possible to suppress evaporation of the organic acid. As a result, the solder composition becomes highly active at a relatively low temperature, so that bumping can be performed at a relatively low temperature. Furthermore, it is possible to reach a desired heating temperature by a relatively small energy through decreasing the energy that is deprived by evaporation of the breakdown product. Therefore, there is an advantage of saving the energy.

INDUSTRIAL APPLICABILITY

As described above, the present invention is capable of suppressing the influence imposed upon a liquid solder even when the liquid solder is used for a solder composition, so that it is possible to form bumps accurately.

BRIEF DESCRIPTION OF THE DRAWINGS

FIG. 1 shows a heating device according to a first embodiment of the present invention, in which

FIG. 3 is a sectional view showing an example of a solder bump forming method that uses the heating device of FIG. 1;

FIG. 8 shows photographs showing results of reflow according to the embodiments of the present invention, in which

Figure 1A:
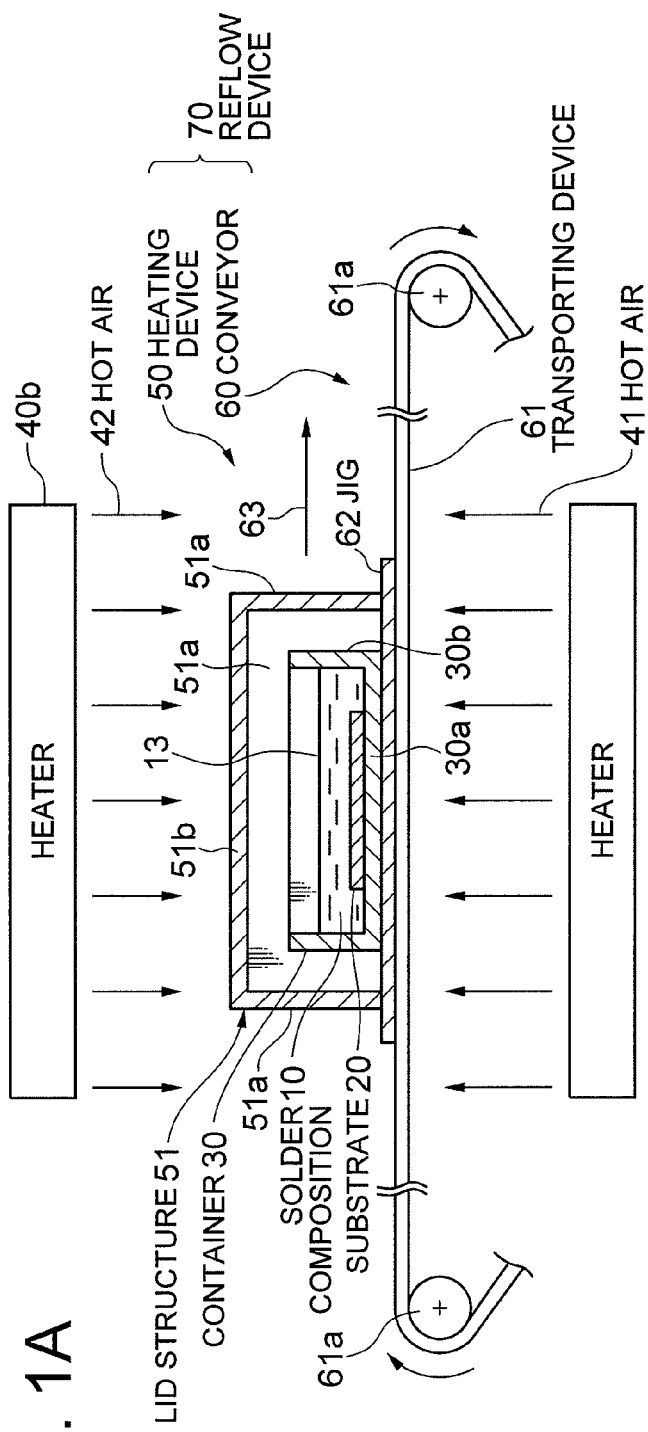
FIG. 1A is a longitudinal sectional view taken along the line I-I in the length direction of a transporting path shown in FIG. 1B.
Figure 1B:
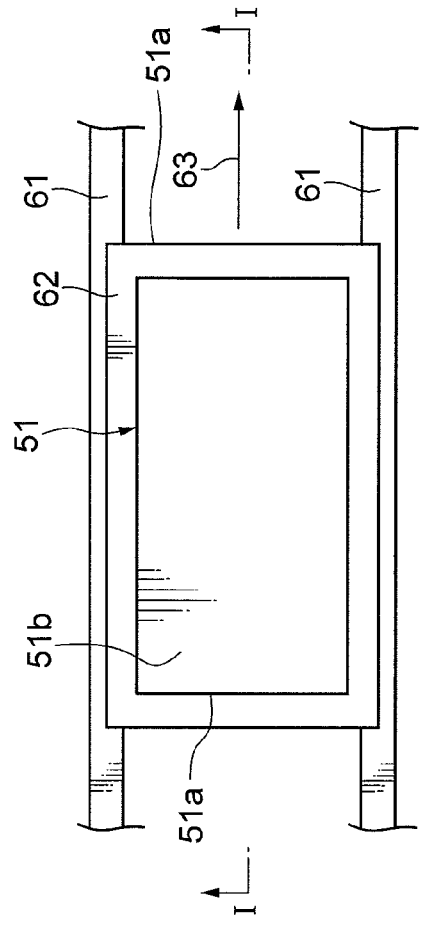
FIG. 1B is a plan view.
Figure 2A:
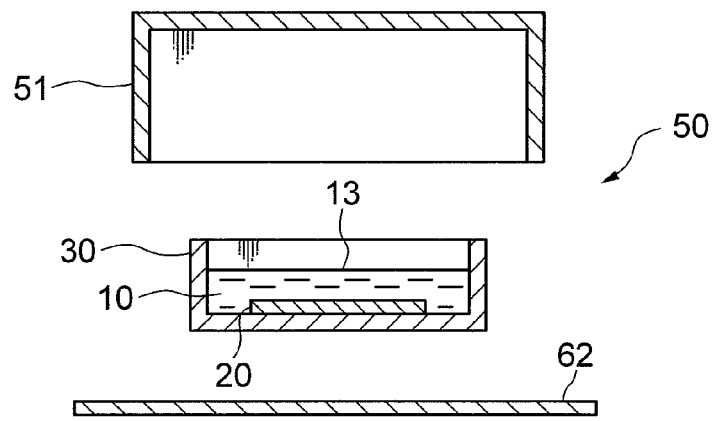
FIG. 2 shows illustrations of steps in sectional views for describing a heating method that uses the heating device of FIG. 1.
Figure 2B:
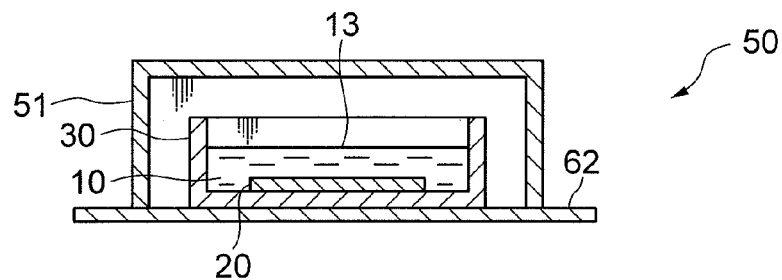
Figure 2C:
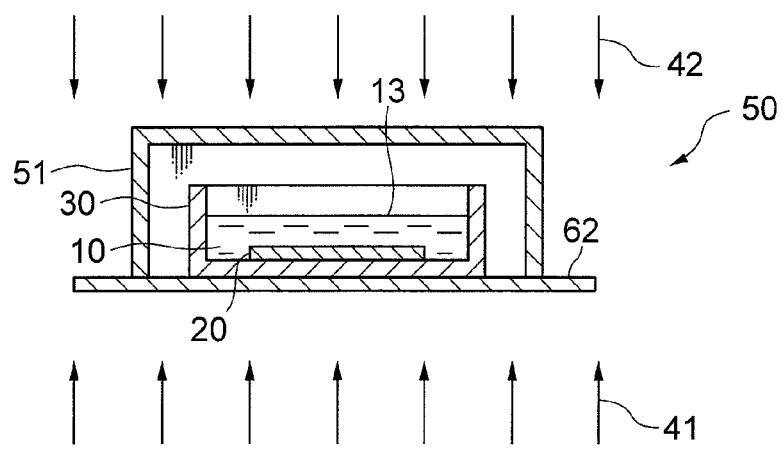
Figure 4A:
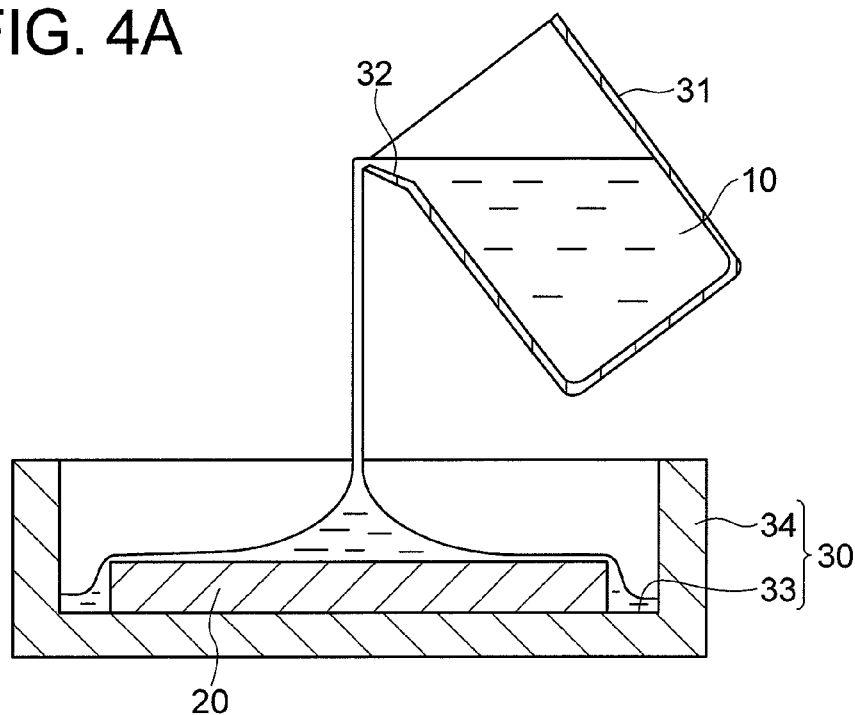
FIG. 4 shows illustrations of steps in sectional views for describing the solder bump forming method that uses the heating device of FIG. 1.
Figure 4B:
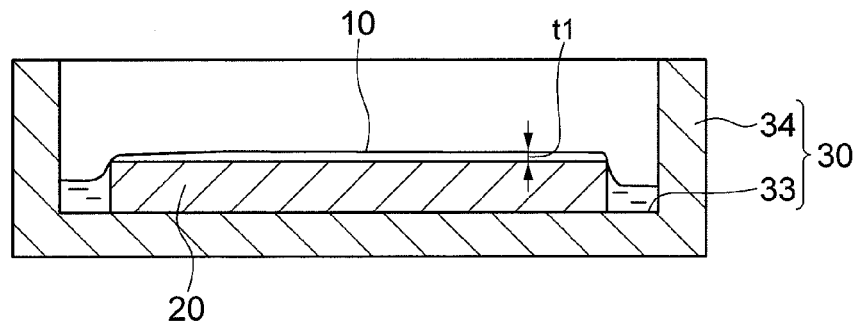
Figure 4C:
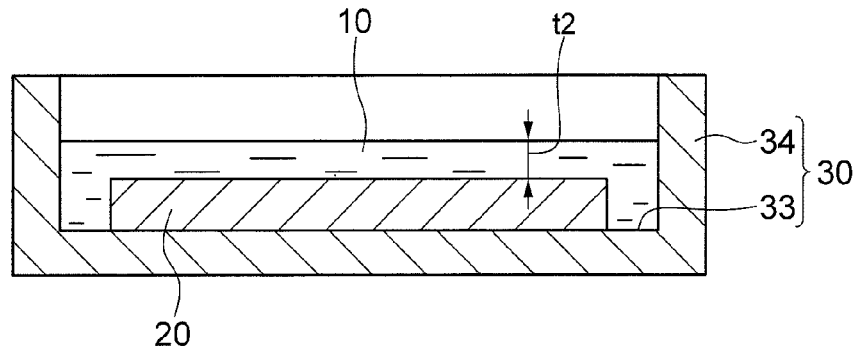
Figure 5A:
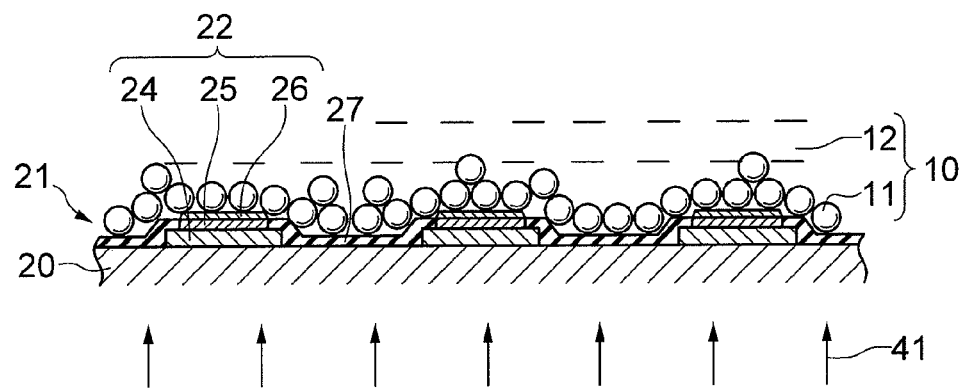
FIG. 5 shows illustrations of steps in sectional views for describing the solder bump forming method that uses the heating device of FIG. 1.
Figure 5B:
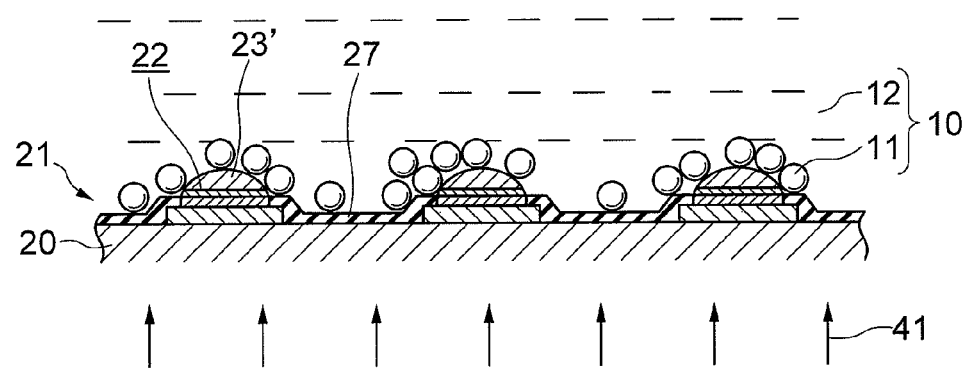
Figure 5C:
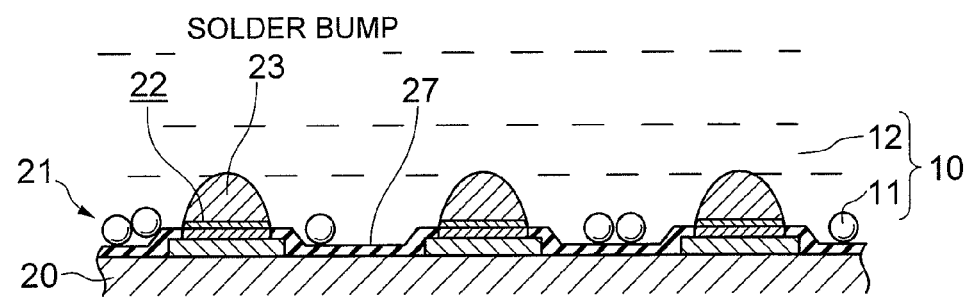
Figure 6A:
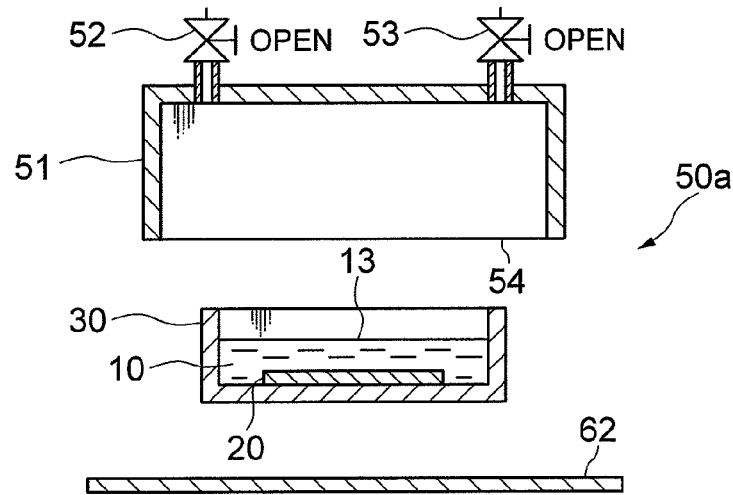
FIG. 6 shows sectional views for describing a heating device according to a second embodiment of the present invention.
Figure 6B:
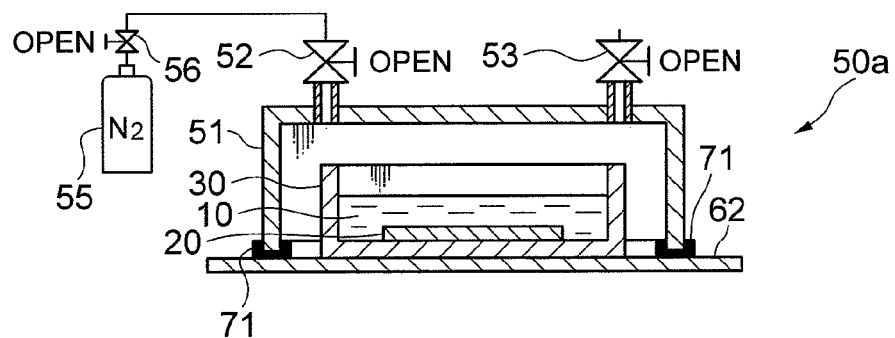
Figure 6C:
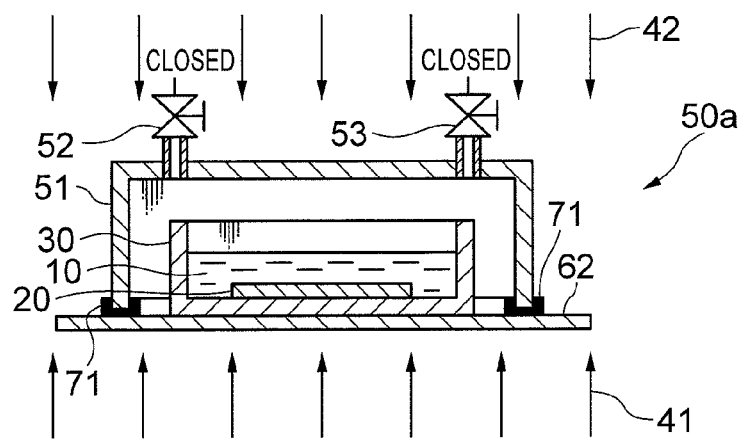
Figure 7A:
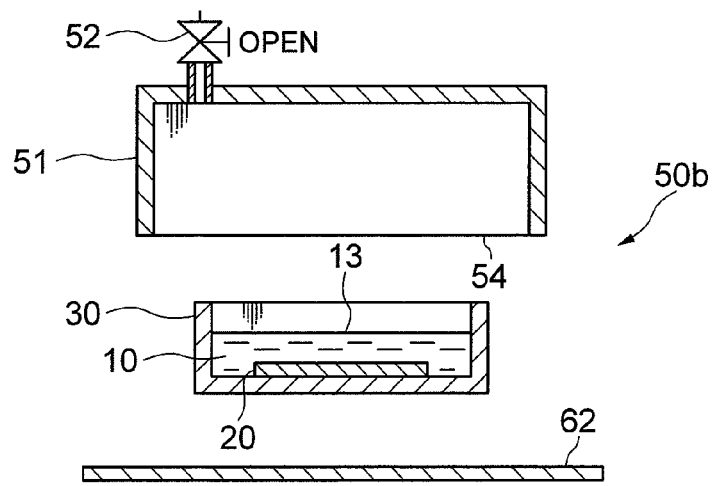
FIG. 7 shows sectional views for describing a heating device according to a third embodiment of the present invention.
Figure 7B:
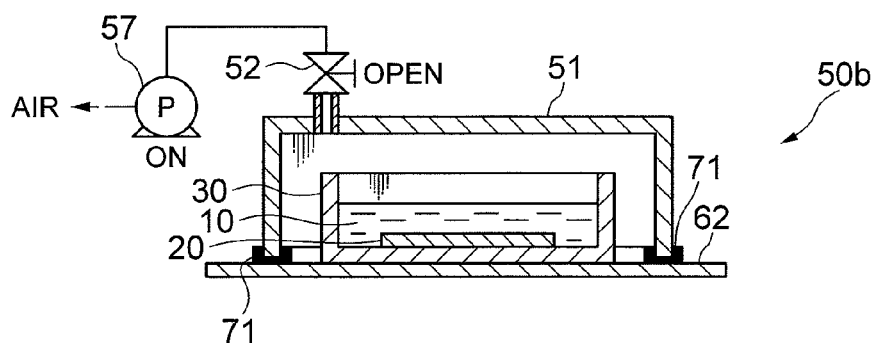
Figure 7C:
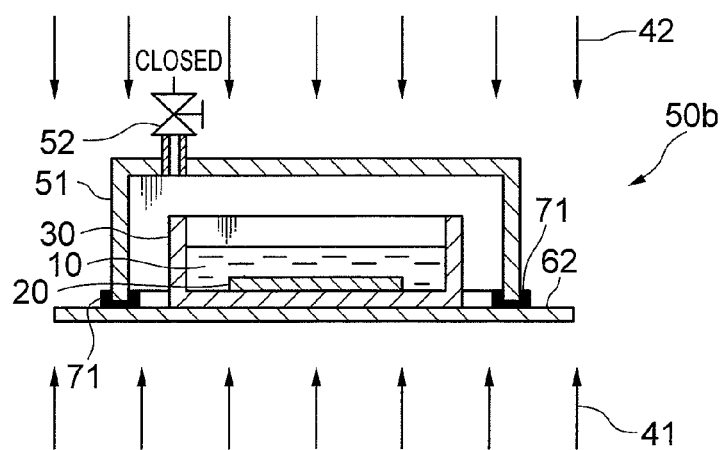
Figure 8A:
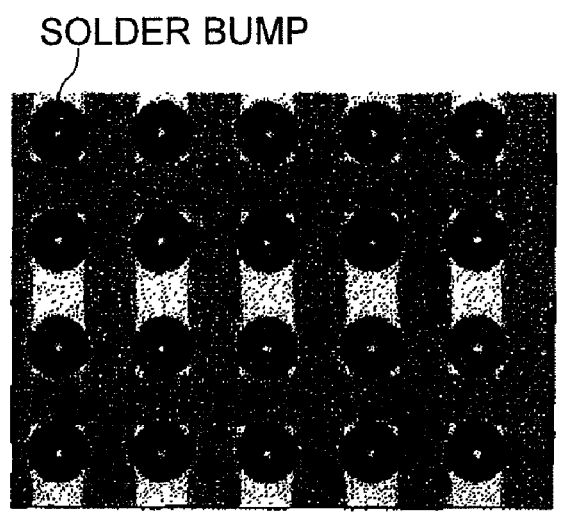
FIG. 8A is a case with a lid structure and FIG. 8B is a case without a lid structure.
Figure 8B:
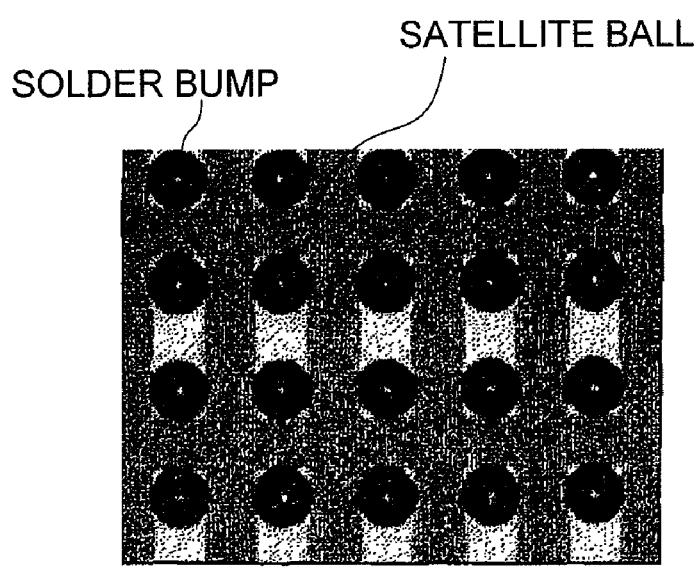
Figure 9:
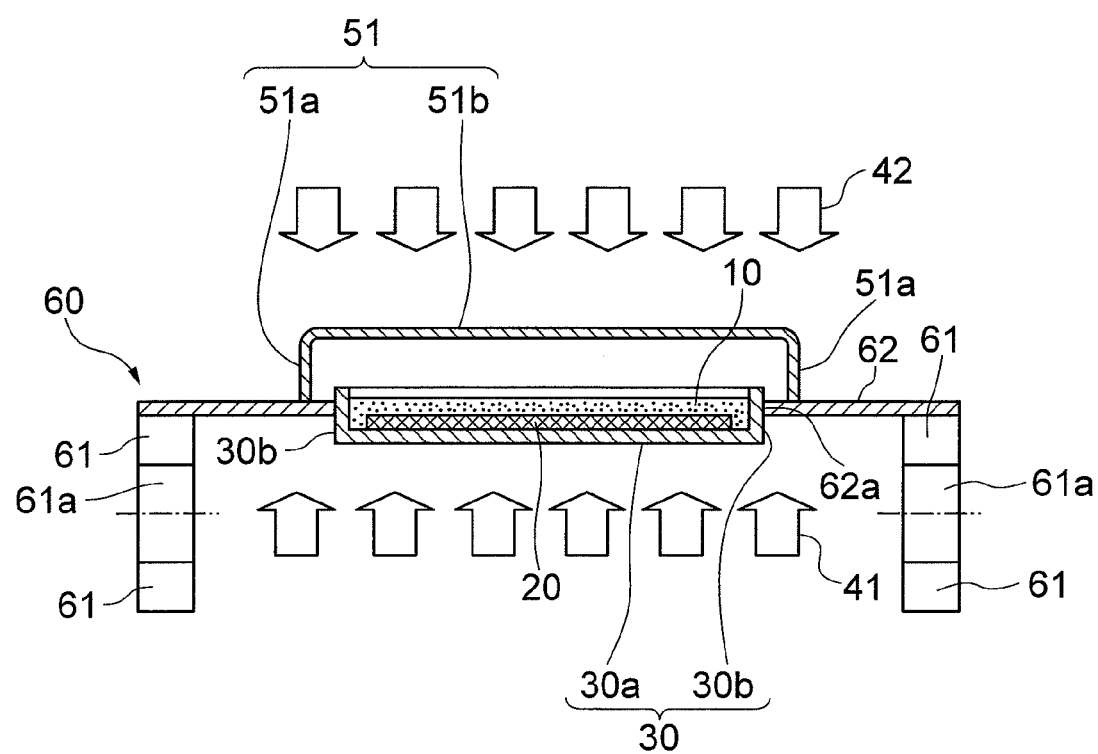
FIG. 9 is a longitudinal sectional view showing a structure for supporting a container that is a kind of a heat-target to a transporting device, which is taken along the direction crossing with the transporting path.
Figure 10:
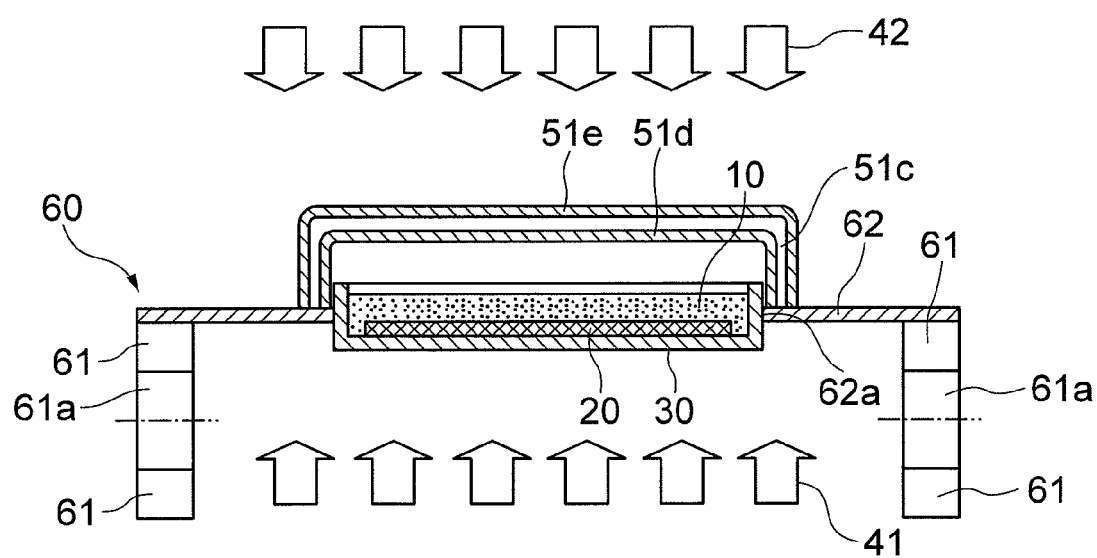
FIG. 10 is a longitudinal sectional view showing a heating device according to a fifth embodiment of the present invention, which is taken along the direction crossing with the transporting path.
Figure 11:
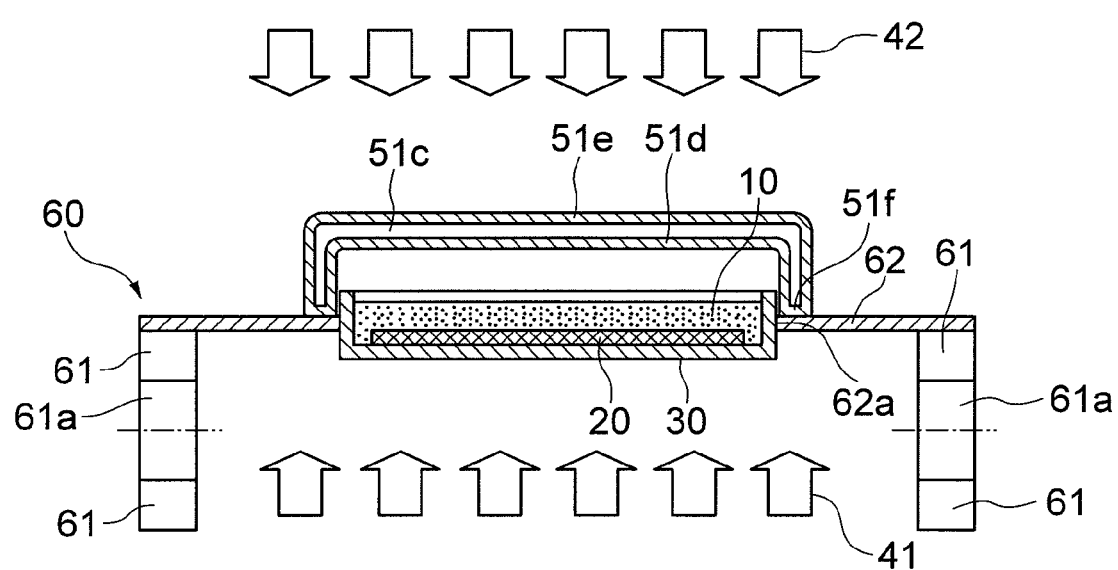
FIG. 11 is a longitudinal sectional view showing a heating device according to a sixth embodiment of the present invention, which is taken along the direction crossing with the transporting path.
Figure 12:
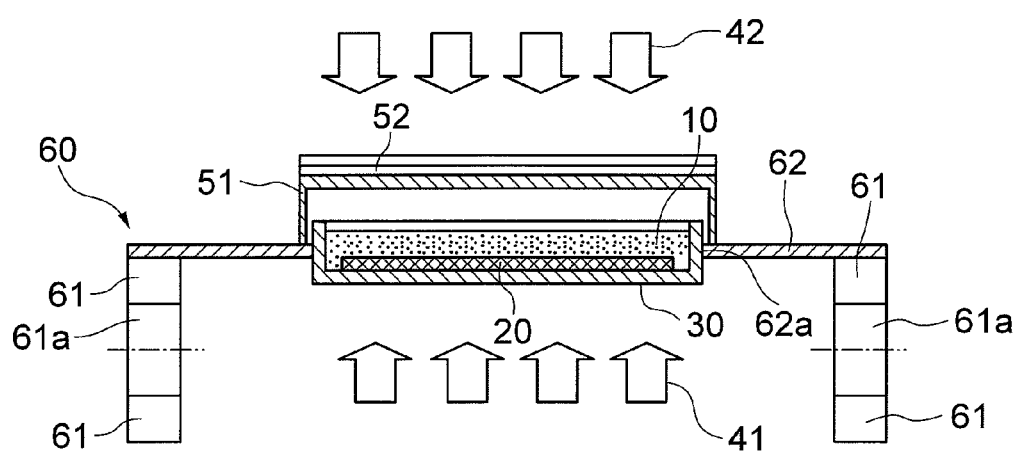
FIG. 12 is a longitudinal sectional view showing a heating device according to a seventh embodiment of the present invention, which is taken along the direction crossing with the transporting path.
Figure 13:
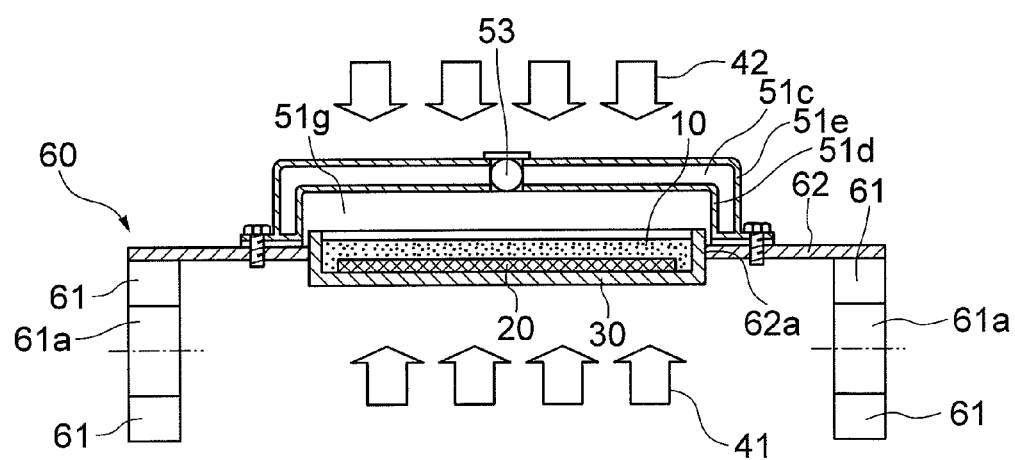
FIG. 13 is a longitudinal sectional view showing a heating device according to an eighth embodiment of the present invention, which is taken along the direction crossing with the transporting path.
Figure 14:
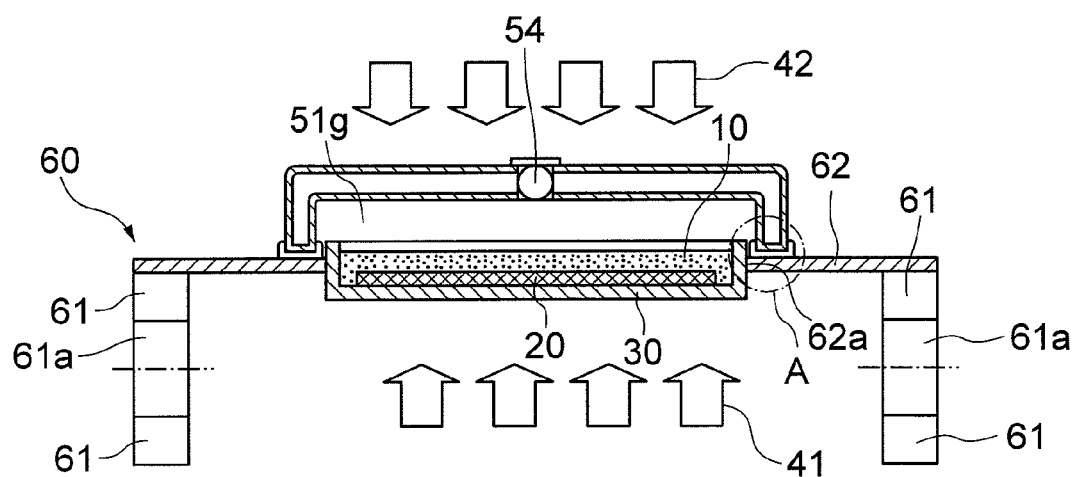
FIG. 14 is a longitudinal sectional view showing a heating device according to a ninth embodiment of the present invention, which is taken along the direction crossing with the transporting path.
Figure 15:
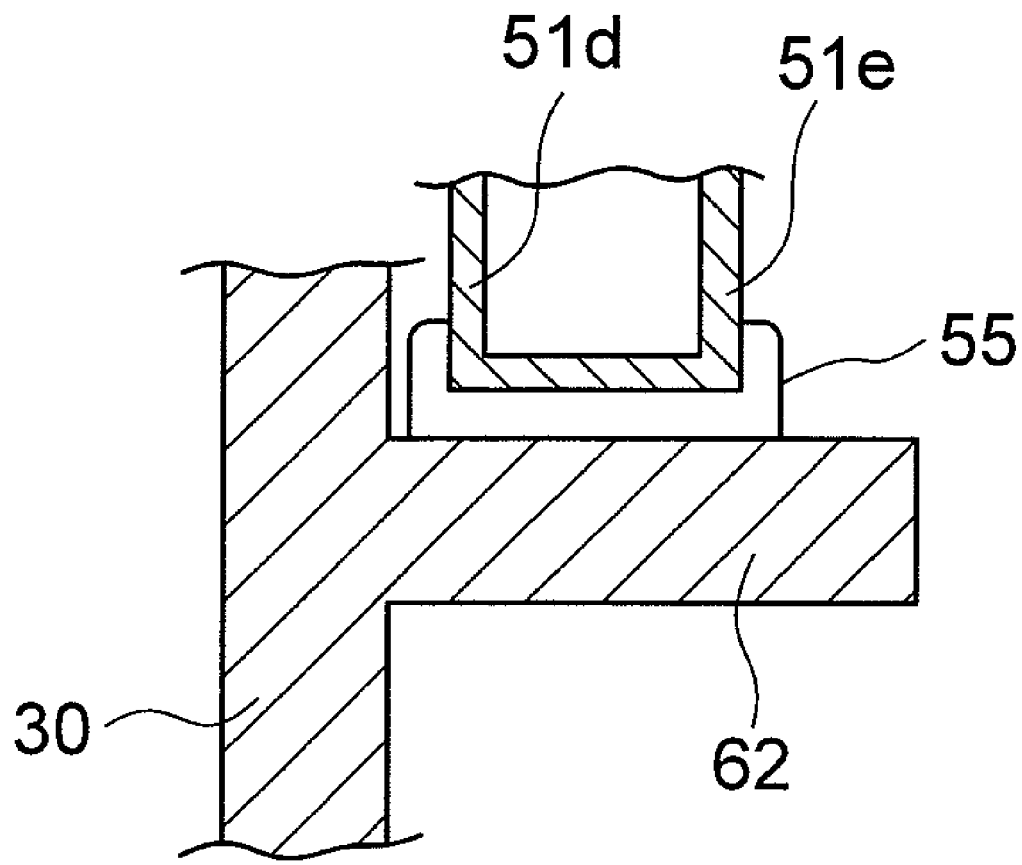
FIG. 15 is an enlarged view of the A-part shown in FIG. 14.

DESCRIPTION OF THE SYMBOLS 10 solder composition
11 solder particles
12 liquid-state substance (liquid material)
20 substrate
21 surface
22 pad electrode
23 solder bumps
30 container
40 heater
41, 42 hot air
50, 50a, 50b heating device
51, 51a, 51b lid structure (hot-air suppressing device)
52, 53 valve
55 nitrogen tank
57 vacuum pump
60 conveyor (transporting path)
61 transporting device
62 jig
70 reflow device

The invention claimed is:

1. A heating device for heating a heat-target and a solder composition with hot air, the heating device comprising:
a container that holds the solder composition and the heat-target, the container having a bottom surface and side walls, and an opening provided in an upper surface of the container to define a recess which holds the solder composition;
a heater that heats the heat-target, the heater having a heating space;
a jig, having a planar surface, transported along a transportation path within the heating space of the heater; and
a hot-air suppressing device that suppresses contact between the hot air and the solder composition, the hot-air suppressing device comprising a lid having a closed upper surface, and the lid and the jig defining an interior space in which the container is positioned,
wherein the container is completely surrounded by the lid and the jig such that the container is positioned on the jig so as not to engage the lid, the lid being supported on the planar surface of the jig and having side surfaces that surround the side walls of the container,
wherein the heater is configured to emit heat from above and beneath the hot-air suppressing device, and
wherein the planar surface of the jig contacts the entire bottom surface of the container.

2. The heating device as claimed in claim 1, wherein the lid of the hot-air suppressing device covers the heat-target.

3. The heating device as claimed in claim 1, wherein the lid of the hot-air suppressing device comprises a valve mechanism which keeps the interior space to a negative pressure state, a pressure state or a low-oxygen atmosphere.

4. The heating device as claimed in claim 1, wherein the lid of the hot-air suppressing device comprises a mechanism which keeps the interior space to a low-oxygen atmosphere.

5. The heating device as claimed in claim 1, wherein the interior space is under an atmospheric atmosphere.

6. The heating device as claimed in claim 1, wherein the lid of the hot-air suppressing device comprises a mechanism which keeps the interior space to a negative-pressure atmosphere.

7. The heating device as claimed in claim 1, the lid of the hot-air suppressing device comprises a mechanism which keeps the interior space to a pressurized atmosphere.

8. The heating device as claimed in claim 1, wherein the hot-air suppressing device comprises a mechanism for controlling a temperature of radiation heat.

9. The heating device as claimed in claim 1, wherein the lid of the hot-air suppressing device comprises a double structure, which is provided with a heat insulating layer.

10. The heating device as claimed in claim 1, wherein the lid of the hot-air suppressing device comprises an integrated double structure.

11. The heating device as claimed in claim 1, wherein the lid of the hot-air suppressing device is provided to every zone on the transportation path on which the heat-target is transported.

12. The heating device as claimed in claim 1,
wherein the lid of the hot-air suppressing device comprises a plurality of lids,
wherein the heat-target comprises a plurality of heat-targets, and
wherein each lid individually covers each heat-target.

* * * * *